US011335614B2

(12) United States Patent
Morita et al.

(10) Patent No.: US 11,335,614 B2
(45) Date of Patent: May 17, 2022

(54) ELECTRIC COMPONENT EMBEDDED STRUCTURE

(71) Applicant: TDK CORPORATION, Tokyo (JP)

(72) Inventors: Takaaki Morita, Tokyo (JP); Kenichi Yoshida, Tokyo (JP); Mitsuhiro Tomikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 120 days.

(21) Appl. No.: 16/754,395

(22) PCT Filed: Oct. 25, 2018

(86) PCT No.: PCT/JP2018/039748
§ 371 (c)(1),
(2) Date: Nov. 9, 2020

(87) PCT Pub. No.: WO2019/082987
PCT Pub. Date: May 2, 2019

(65) Prior Publication Data
US 2021/0057296 A1    Feb. 25, 2021

(30) Foreign Application Priority Data

Oct. 26, 2017    (JP) .............................. JP2017-207416

(51) Int. Cl.
*H05K 1/18*        (2006.01)
*H01L 23/12*       (2006.01)
(Continued)

(52) U.S. Cl.
CPC ........ *H01L 23/12* (2013.01); *H01L 23/49822* (2013.01); *H01L 24/19* (2013.01);
(Continued)

(58) Field of Classification Search
CPC ... H01L 23/12; H01L 23/49822; H01L 24/19; H01L 23/13; H01L 23/49838;
(Continued)

(56) References Cited

U.S. PATENT DOCUMENTS

2006/0273461 A1    12/2006  Otsuka
2007/0045815 A1     3/2007  Urashima et al.
(Continued)

FOREIGN PATENT DOCUMENTS

JP    2007-096273 A     4/2007
JP    2007-258542 A    10/2007
(Continued)

OTHER PUBLICATIONS

English Translation JP2007258542, Masaki Muramatsu, NGK SPark Plug Co. Ltd. (Year: 2007).*
(Continued)

*Primary Examiner* — Steven T Sawyer
(74) *Attorney, Agent, or Firm* — Oliff PLC

(57) ABSTRACT

In an electric component embedded structure, a first electrode terminal provided on a first main surface includes an intra-area terminal, and the intra-area terminal is electrically connected to an overlap portion of an overlap wiring in a formation area of an electric component. Accordingly, a decrease in mounting area of the electric component embedded structure is achieved. The intra-area terminal can be electrically connected to a second electrode terminal provided on a second main surface via a first via-conductor, the overlap wiring, and a second via-conductor. The intra-area terminal is connected to a wiring (an overlap wiring) of a first insulating layer without additionally providing a rewiring layer causing an increase in thickness, and the increase in thickness is curbed, whereby a decrease in size of the electric component embedded structure is achieved.

7 Claims, 16 Drawing Sheets

(51) Int. Cl.
*H01L 23/498* (2006.01)
*H01L 23/00* (2006.01)

(52) U.S. Cl.
CPC ............ *H05K 1/182* (2013.01); *H05K 1/183* (2013.01); *H05K 1/185* (2013.01); *H05K 2201/0939* (2013.01)

(58) Field of Classification Search
CPC ............ H01L 23/145; H01L 23/49816; H01L 23/49827; H01L 25/00; H05K 3/46; H05K 1/182; H05K 1/183; H05K 1/185; H05K 1/184; H05K 1/111; H05K 2201/09372; H05K 2201/0939
See application file for complete search history.

(56) References Cited

U.S. PATENT DOCUMENTS

| | | | | |
|---|---|---|---|---|
| 2007/0281394 | A1* | 12/2007 | Kawabe | ............ H01L 21/4857 438/118 |
| 2013/0242517 | A1 | 9/2013 | Fujidai et al. | |
| 2015/0092373 | A1* | 4/2015 | Chan | ...................... H05K 1/112 361/767 |
| 2015/0282328 | A1 | 10/2015 | Hamada et al. | |
| 2016/0190059 | A1 | 6/2016 | Tseng et al. | |
| 2016/0353576 | A1* | 12/2016 | Kusama | ............ H01L 23/49827 |
| 2017/0094797 | A1* | 3/2017 | Baek | ...................... H05K 1/185 |
| 2018/0098430 | A1* | 4/2018 | Sato | ........................ H01L 24/16 |

FOREIGN PATENT DOCUMENTS

| | | |
|---|---|---|
| JP | 2013-042164 A | 2/2013 |
| JP | 2015-185812 A | 10/2015 |
| TW | 200707671 A | 2/2007 |
| TW | 201543621 A | 11/2015 |
| TW | 201625100 A | 7/2016 |

OTHER PUBLICATIONS

Dec. 25, 2018 International Search Report issued in International Patent Application No. PCT/JP2018/039748.

Apr. 28, 2020 International Preliminary Report on Patentability issued in International Patent Application No. PCT/JP2018/039748.

* cited by examiner

Fig.7
(a) 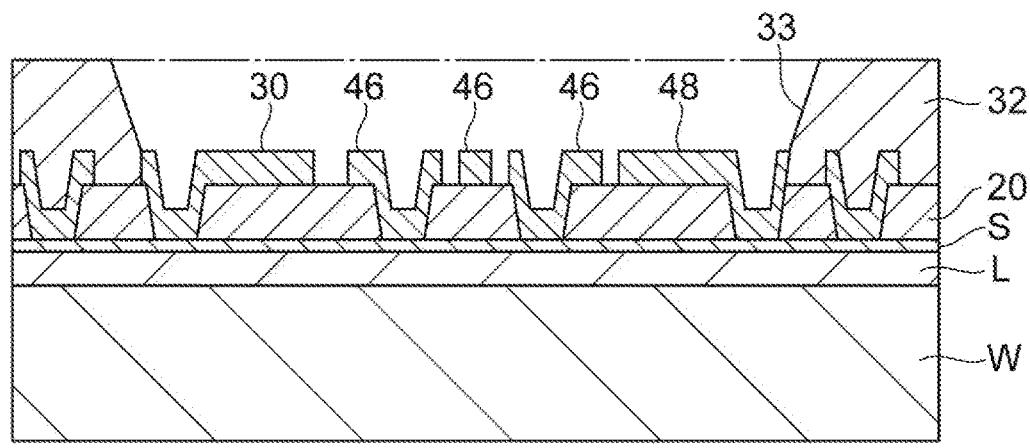
(b) 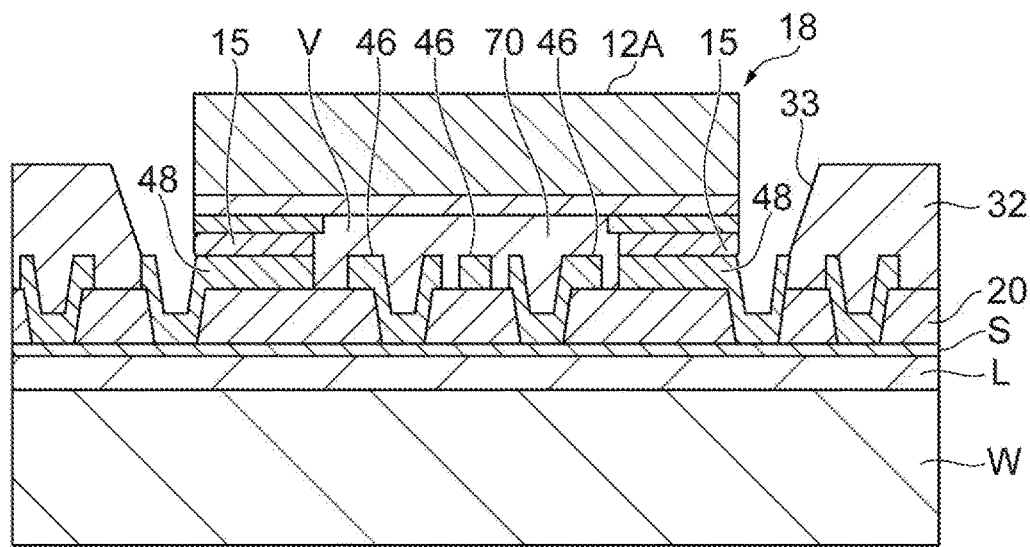
(c) 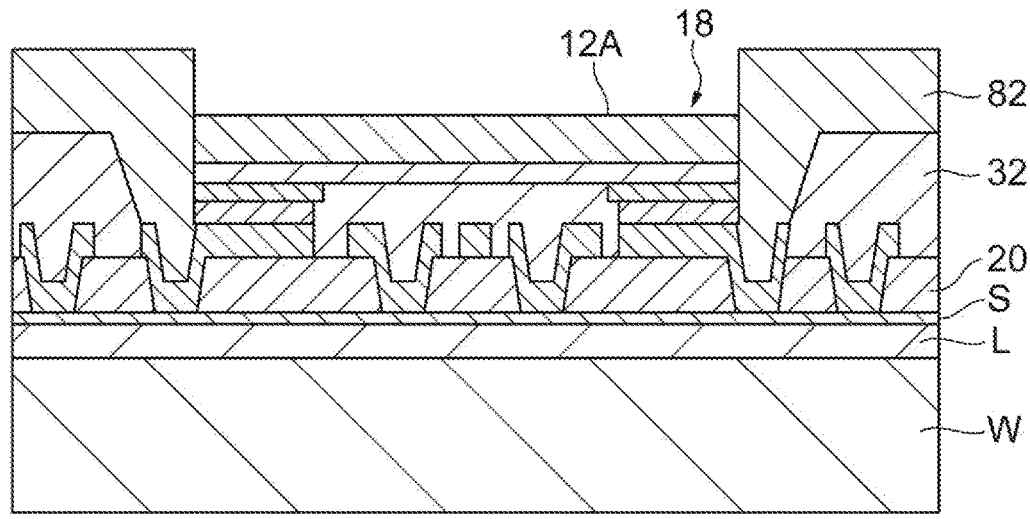

*Fig.8*
(a)
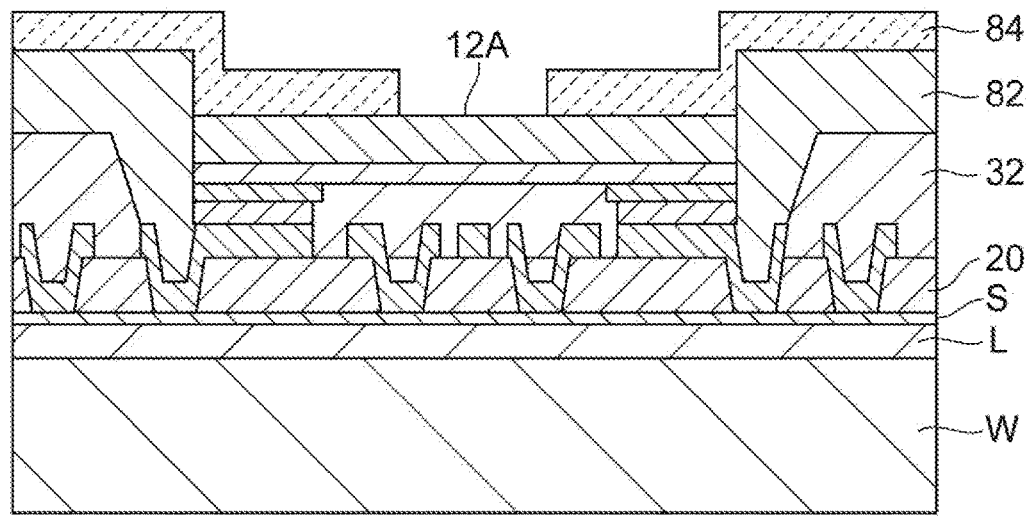
(b)
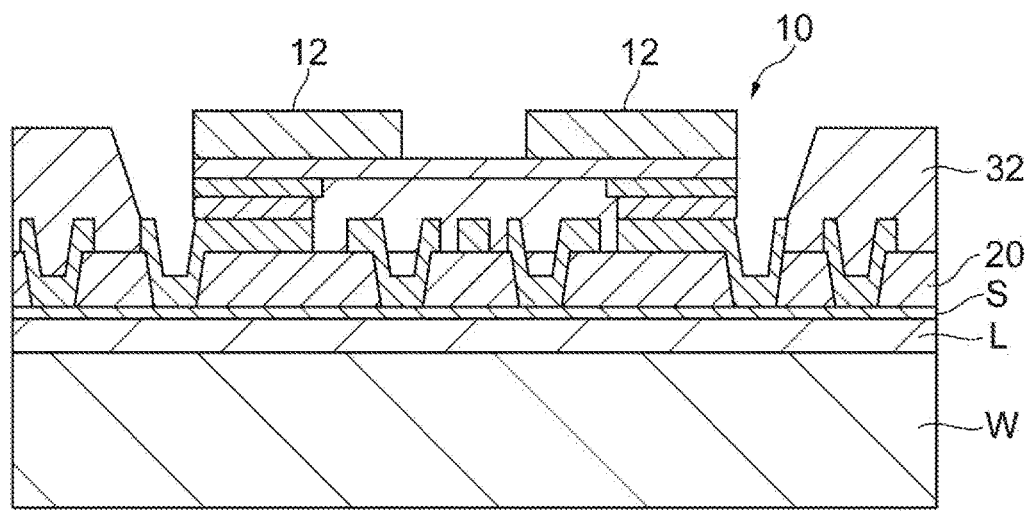

Fig.9
(a)
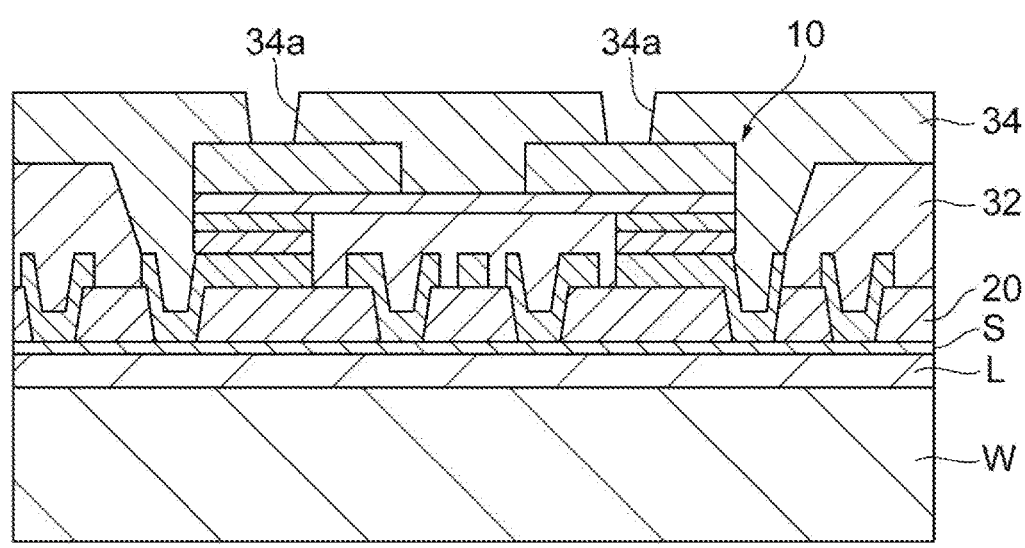
(b)
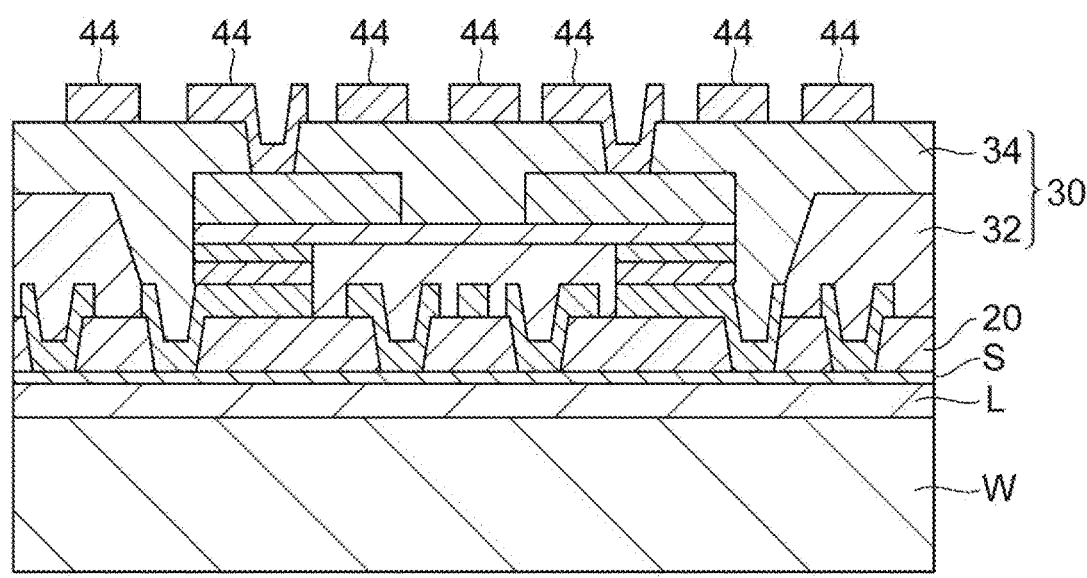

ELECTRIC COMPONENT EMBEDDED STRUCTURE

CROSS-REFERENCE TO RELATED APPLICATIONS

This application is a 35 U.S.C. § 371 national phase application of PCT/JP2018/039748, filed on Oct. 25, 2018, which claims priority to Japanese Patent Application No. 2017-207416, filed on Oct. 26, 2017.

TECHNICAL FIELD

The present disclosure relates to an electric component embedded structure.

BACKGROUND ART

In the related art, an electric component embedded substrate in which electrode terminals are provided on both surfaces of a structure is known as an electric component embedded structure in which an electric component is embedded. For example, Patent Literature 1 discloses an electric component embedded substrate which includes a plurality of first electrode terminals that are formed on one main surface and that are to be connected to an external substrate or the like and a plurality of second electrode terminals that are formed on the other main surface and that are to be connected to an electric component (for example, semiconductor chip) mounted on the other main surface and in which the first electrode terminals and the second electrode terminals are connected via the electric component or without passing through the electric component.

CITATION LIST

Patent Literature

[Patent Literature 1] Japanese Unexamined Patent Publication No. 2013-42164

SUMMARY OF INVENTION

Technical Problem

The inventors have conducted repeated studies concerning decrease in size of an electric component embedded structure and obtained knowledge that a mounting area of an electric component embedded structure can be decreased by disposing first electrode terminals which are not connected to electrodes of an electric component in a main surface area corresponding to a formation area of the electric component. Here, when a rewiring insulating layer (a rewiring layer) that prevents the first electrode terminals provided on the main surface area corresponding to the formation area of the electric component from being connected to the electrodes of the electric component is provided, the electric component embedded structure increases in thickness and thus a decrease in size of the electric component embedded structure is hindered.

An objective of the present disclosure is to provide an electric component embedded structure that can achieve a decrease in size.

Solution to Problem

According to an aspect of the present disclosure, there is provided an electric component embedded structure having a first main surface and a second main surface opposite to the first main surface, the electric component embedded structure including: a first insulating layer constituting the first main surface; a wiring stacked on the first insulating layer; a connecting portion formed in the same layer as the wiring; an electric component mounted on the connecting portion, the electric component located on the same side as the connecting portion in a stacking direction and having a first electrode layer electrically connected to the connecting portion; a second insulating layer integrally covering the electric component and the wiring formed on the first insulating layer; a plurality of first electrode terminals provided on the first main surface; and a plurality of first via-conductors penetrating the first insulating layer in the stacking direction, and electrically connecting the wiring and the connecting portion to the first electrode terminals, wherein the plurality of first electrode terminals include an intra-area terminal located in a formation area of the electric component when seen in the stacking direction, and the wiring extends into the formation area of the electric component and terminates in the formation area when seen in the stacking direction and includes an overlap portion electrically connected to the intra-area terminal via the first via-conductor in the formation area of the electric component.

In the electric component embedded structure, the first electrode terminal provided on the first main surface includes the intra-area terminal located in the formation area of the electric component when seen in the stacking direction. The intra-area terminal is electrically connected to the overlap portion of the wiring extending into the formation area of the electric component on the first insulating layer in the formation area. In the electric component embedded structure, since the wiring is formed on the first insulating layer without providing a rewiring layer, it is possible to achieve a decrease in mounting area without increasing a thickness.

In the aspect, the electric component further has a second electrode layer located on opposite side of the first electrode layer, and the electric component embedded structure further includes a plurality of second electrode terminals being exposed and being provided on the second main surface and a plurality of second via-conductors extending in the stacking direction, penetrating the second insulating layer, and electrically connecting the second electrode layer of the electric component to the second electrode terminals. In this case, the intra-area terminal which is electrically connected to the overlap portion of the wiring can be electrically connected to the second electrode terminal provided on the second main surface via the wiring and the second via-conductor. In the electric component embedded structure, since the intra-area terminal is connected to the wiring on the first insulating layer without providing a rewiring layer, it is possible to achieve a decrease in mounting area without increasing the thickness.

In the aspect, the second insulating layer includes a first layer and a second layer, the first layer and the second layer are stacked sequentially from the first insulating layer side, and the first layer includes a cavity portion open to expose the connecting portion on the first insulating layer and the electric component is disposed in the cavity portion. By disposing the electric component in the cavity portion of the second insulating layer, it is possible to achieve a decrease in thickness of the electric component embedded structure.

In the aspect, the electric component embedded structure further includes an insulator interposed between the electric component and the first insulating layer, and the overlap portion of the wiring is covered by the insulator. Since an influence of an external force on the overlap portion of the wiring can be decreased by covering the overlap portion of the wiring with the insulator, it is possible to narrow the overlap portion of the wiring. Accordingly, it is possible to have greater latitude for design of the wiring.

In the aspect, the electric component embedded structure includes a plurality of the wirings, and the plurality of wirings include a wiring including the overlap portion terminating in the formation area of the electric component and a wiring crossing the formation area of the electric component. In this case, it is possible to have greater latitude for design of the wiring.

In the aspect, the electric component embedded structure includes a plurality of the electric components and a plurality of the connecting portions corresponding to the electric components, and the plurality of electric components are arranged adjacent to each other in a direction perpendicular to the stacking direction. In this case, the formation areas of the plurality of electric components adjacent to each other can be considered as one large formation area, and since the intra-area terminals located in the large formation area are connected to the wirings on the first insulating layer without providing a rewiring layer, it is possible to achieve a decrease in mounting area without increasing the thickness.

Advantageous Effects of Invention

According to the present disclosure, it is possible to provide an electric component embedded structure that can achieve a decrease in size.

BRIEF DESCRIPTION OF DRAWINGS

FIG. 7 is a diagram illustrating steps of the method of manufacturing the electric component embedded structure illustrated in FIG. 1.

FIG. 8 is a diagram illustrating steps of the method of manufacturing the electric component embedded structure illustrated in FIG. 1.

FIG. 9 is a diagram illustrating steps of the method of manufacturing the electric component embedded structure illustrated in FIG. 1.

DESCRIPTION OF EMBODIMENTS

Figure 1:
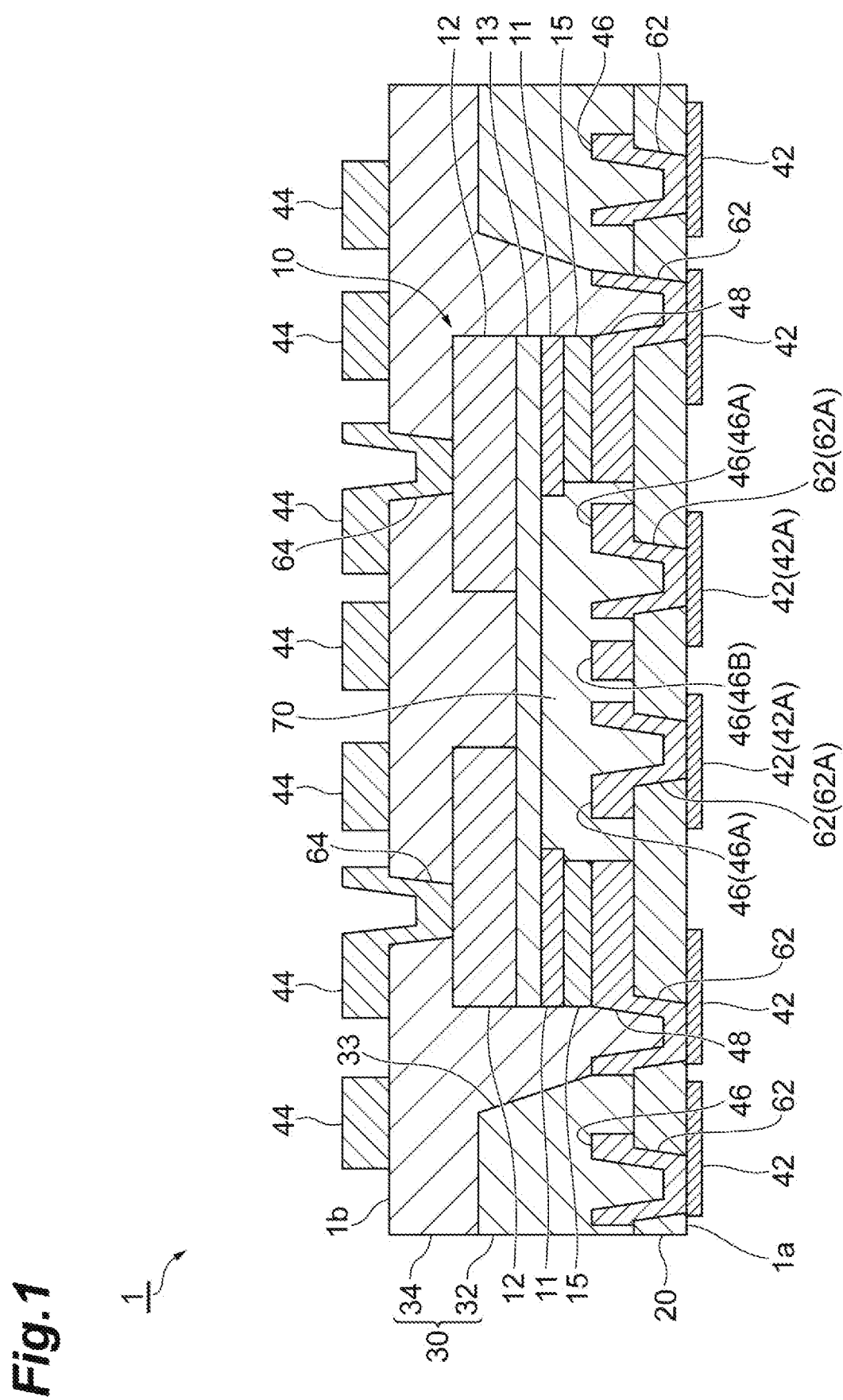
FIG. 1 is a sectional view schematically illustrating an electric component embedded structure according to an embodiment of the present disclosure.

Hereinafter, various embodiments will be described in detail with reference to the accompanying drawings. In the drawings, the same or corresponding elements will be referred to by the same reference signs and description thereof will not be repeated.

FIG. 1 is a sectional view schematically illustrating an electric component embedded structure according to an embodiment of the present disclosure. As illustrated in FIG. 1, an electric component embedded structure 1 is a structure in which an electric component 10 which will be described later is embedded and is used for, for example, a communication terminal. The electric component embedded structure 1 includes a stacked structure in which a second insulating layer 30 is stacked on a first insulating layer 20. The first insulating layer 20 and the second insulating layer 30 are formed of, for example, an insulating material such as an epoxy resin, a polyimide resin, an acryl resin, or a phenol resin. The insulating material constituting the second insulating layer 30 may be a material of which hardness is changed through a specific treatment such as a thermosetting resin or a photo-curable resin. The bottom surface of the first insulating layer 20 constitutes one main surface (a first main surface) 1*a* of the electric component embedded structure 1 and the top surface of the second insulating layer 30 constitutes a main surface (a second main surface) 1*b* on the side opposite to the first main surface 1*a*.

Figure 2:
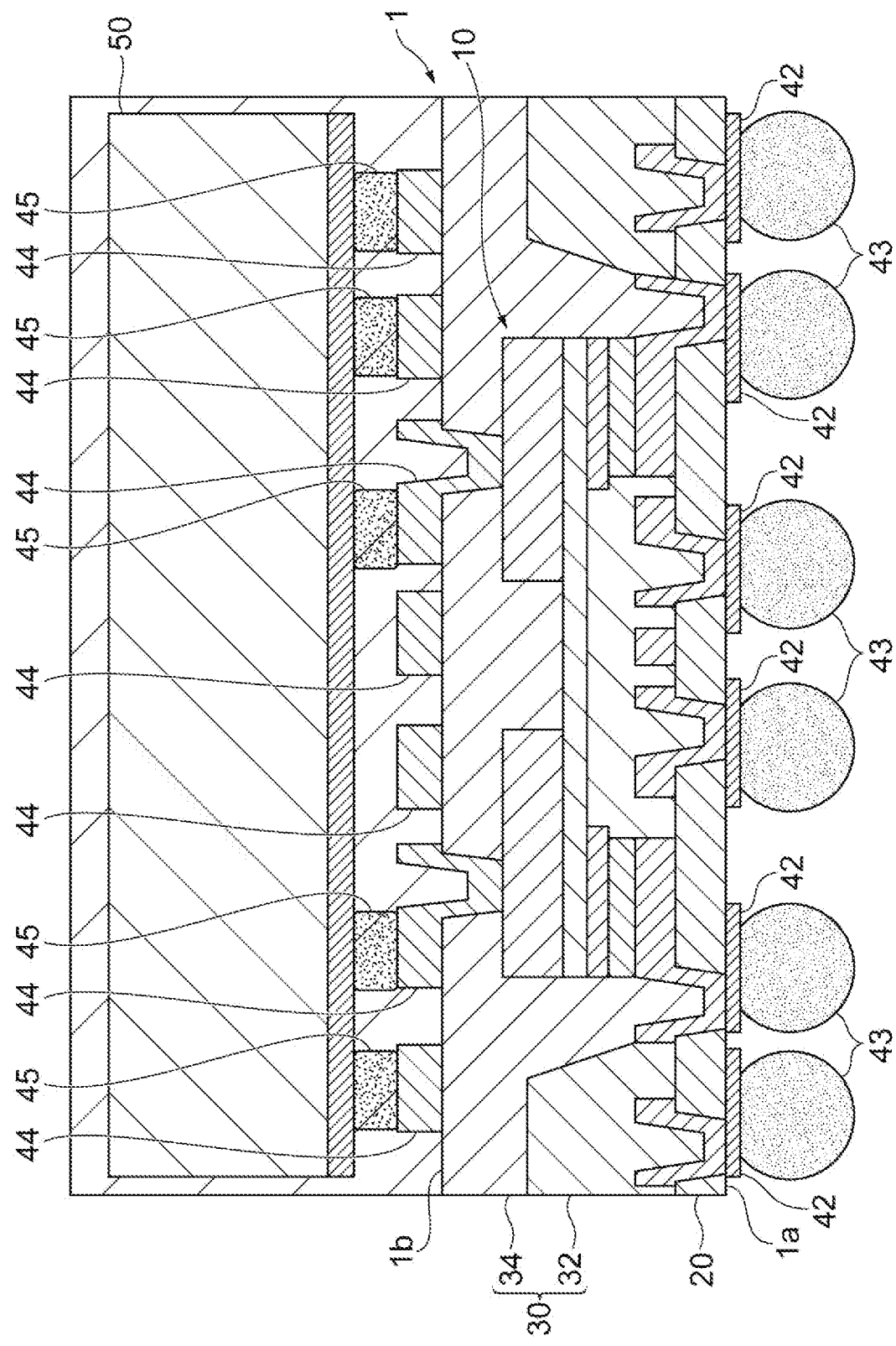
FIG. 2 is a sectional view illustrating an example of a mounting mode of the electric component embedded structure illustrated in FIG. 1.

A plurality of first electrode terminals 42 are provided on the first main surface 1*a* of the electric component embedded structure 1. Each first electrode terminal 42 is formed of a conductive material such as Cu. In this embodiment, each first electrode terminal 42 is provided to overlap the first main surface 1*a*, but may be provided to be embedded in the first insulating layer 20. As illustrated in FIG. 2, for example, a solder bump 43 is provided on each first electrode terminal 42. Each first electrode terminal 42 is connected to an external substrate (not illustrated) facing the first main surface 1*a* of the electric component embedded structure 1 via the solder bump 43.

Referring back to FIG. 1, a plurality of second electrode terminals 44 are provided on the second main surface 1*b* of the electric component embedded structure 1. Each second electrode terminal 44 is formed of a conductive material such as Cu similarly to the first electrode terminals 42. In this embodiment, each second electrode terminal 44 is provided to overlap the second main surface 1b, but may be provided to be embedded in the second insulating layer 30. As illustrated in FIG. 2, for example, a solder bump 45 is provided on each second electrode terminal 44. Each second electrode terminal 44 is connected to an external electric component 50 such as an IC which is mounted on the second main surface 1b of the electric component embedded structure 1 via the solder bump 45.

As illustrated in FIG. 1, a wiring 46 and a connecting portion 48 are formed on the first insulating layer 20. Since the wiring 46 and the connecting portion 48 are all formed by patterning a conductive layer as will be described later, the wiring 46 and the connecting portion 48 are located in the same layer and have the same thickness. The wiring 46 and the connecting portion 48 are formed of, for example, a conductive material such as Cu. In this embodiment, the electric component embedded structure 1 includes a pair of connecting portions 48. The wiring 46 and the connecting portion 48 are electrically connected to the first electrode terminal 42 via a plurality of first via-conductors 62 extending in the thickness direction of the first insulating layer 20 (that is, the stacking direction of the electric component embedded structure 1) and penetrating the first insulating layer 20.

The electric component 10 is installed on the pair of connecting portions 48 to be suspended on the pair of connecting portions 48. The electric component 10 includes a pair of first electrode layers 11 provided on the bottom thereof to correspond to the pair of connecting portions 48 and a pair of second electrode layers 12 provided on the top thereof. In this embodiment, the electric component 10 is a thin-film capacitor including a dielectric layer 13 which is disposed between the pair of first electrode layers 11 and the pair of second electrode layers 12 and includes two capacitor structures. The electric component 10 can be designed, for example, such that the total thickness ranges from 10 μm to 80 μm, the thickness of the first electrode layer 11 ranges from 0.1 μm to 20 μm, the thickness of the second electrode layer 12 ranges from 0.1 μm to 30 μm, and the thickness of the dielectric layer 13 ranges from 0.05 μm to 0.4 μm. The electric component 10 is connected to the connecting portions 48 via a conductive material layer 15 such as a solder layer. For example, Cu or a Cu alloy is used as the material of the first electrode layer 11. For example, Ni or an Ni alloy is used as the material of the second electrode layer 12. For example, a perovskite-based dielectric material is used as the material of the dielectric layer 13. Here, the electric component 10 may be a so-called multilayered thin-film capacitor having a stacked structure in which a plurality of dielectric layers 13 and a plurality of internal electrode layers are alternately stacked.

The second insulating layer 30 has a two-layer structure including a first layer 32 and a second layer 34. That is, the second insulating layer 30 includes the first layer 32 and the second layer 34 which are sequentially stacked from the first insulating layer 20 side.

The first layer 32 of the second insulating layer 30 covers the wirings 46 formed on the first insulating layer 20 and includes a cavity portion 33 in an area corresponding to the connecting portions 48 formed on the first insulating layer 20. The cavity portion 33 penetrates the first layer 32 in the stacking direction and is open to expose the connecting portions 48 on the first insulating layer 20. The opening size of the cavity portion 33 is designed to be greater than the size of the electric component 10, the electric component 10 is accommodated in the cavity portion 33, and the first electrode layer 11 of the electric component 10 is connected to the connecting portions 48 in the cavity portion 33.

A space V which is defined by the electric component 10 accommodated in the cavity portion 33 and the first insulating layer 20 is formed below the electric component 10. The space V is filled with an insulating resin 70. The insulating resin 70 is formed of, for example, a low-dielectric-constant material (an epoxy resin including a filler) or an underfill material. The wirings 46 located below the electric component 10 are covered by the insulating resin 70.

The second layer 34 of the second insulating layer 30 integrally covers the first layer 32 and the electric component 10 accommodated in the cavity portion 33. A plurality of second via-conductors 64 extending in the thickness direction thereof (that is, the stacking direction of the electric component embedded structure 1) are formed to penetrate the second layer 34, and the second electrode layer 12 of the electric component 10 is electrically connected to the second electrode terminals 44 via the second via-conductors 64. The plurality of second via-conductors 64 may include a second via-conductor 64 penetrating the second insulating layer 30 (the first layer 32 and the second layer 34) and connecting the wirings 46 to the second electrode terminals 44, which is not illustrated in FIGS. 1 and 2, in addition to the second via-conductor 64 penetrating only the second layer 34 as illustrated in FIGS. 1 and 2.

A positional relationship between a formation area of the electric component 10, the first electrode terminals 42, the first via-conductors 62, the connecting portions 48, and the wirings 46 will be described below with reference to FIGS. 3 to 5.

Figure 3:
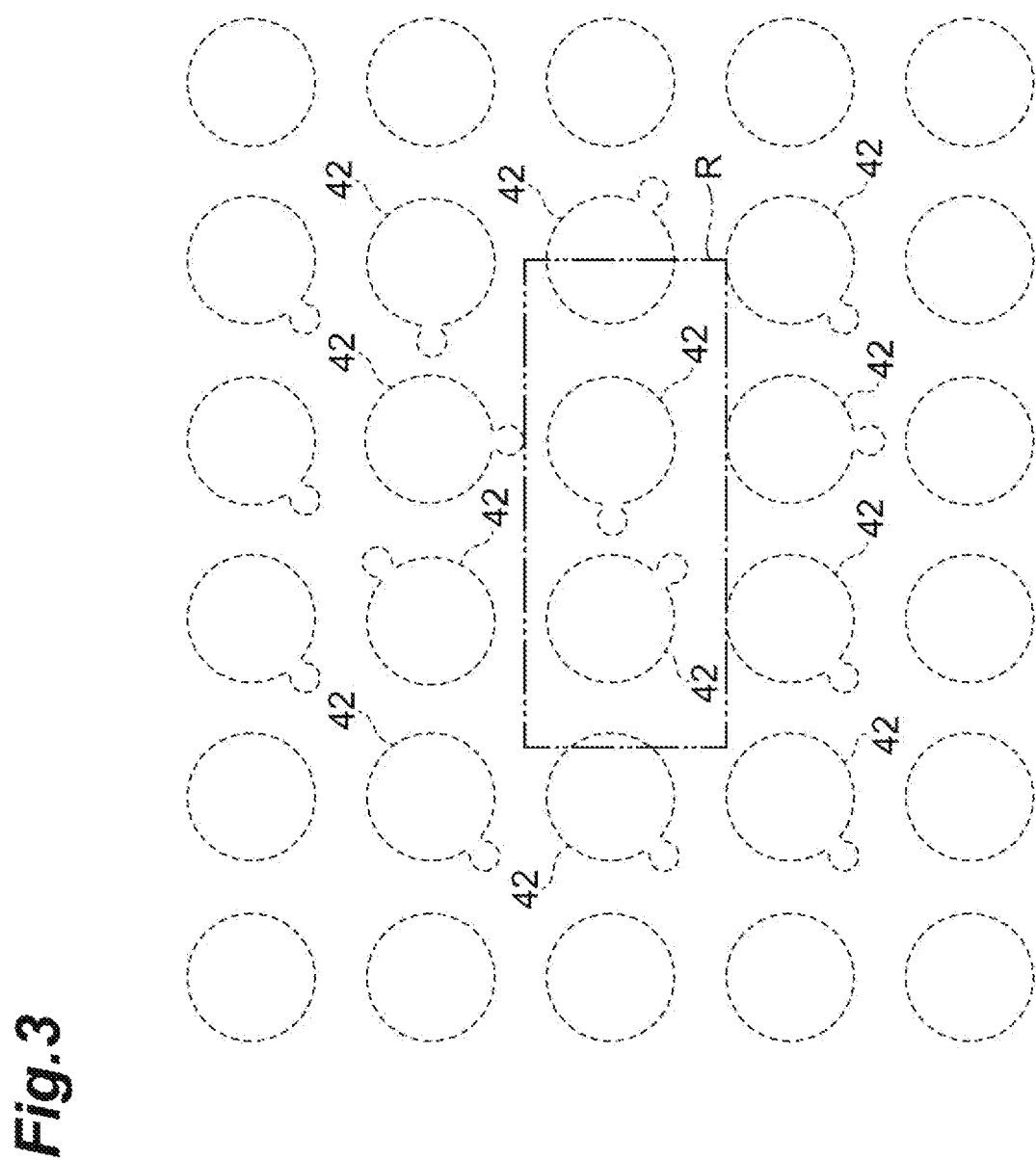
FIG. 3 is a diagram illustrating a positional relationship between a formation area of an electric component and first electrode terminals in the electric component embedded structure illustrated in FIG. 1.
Figure 4:
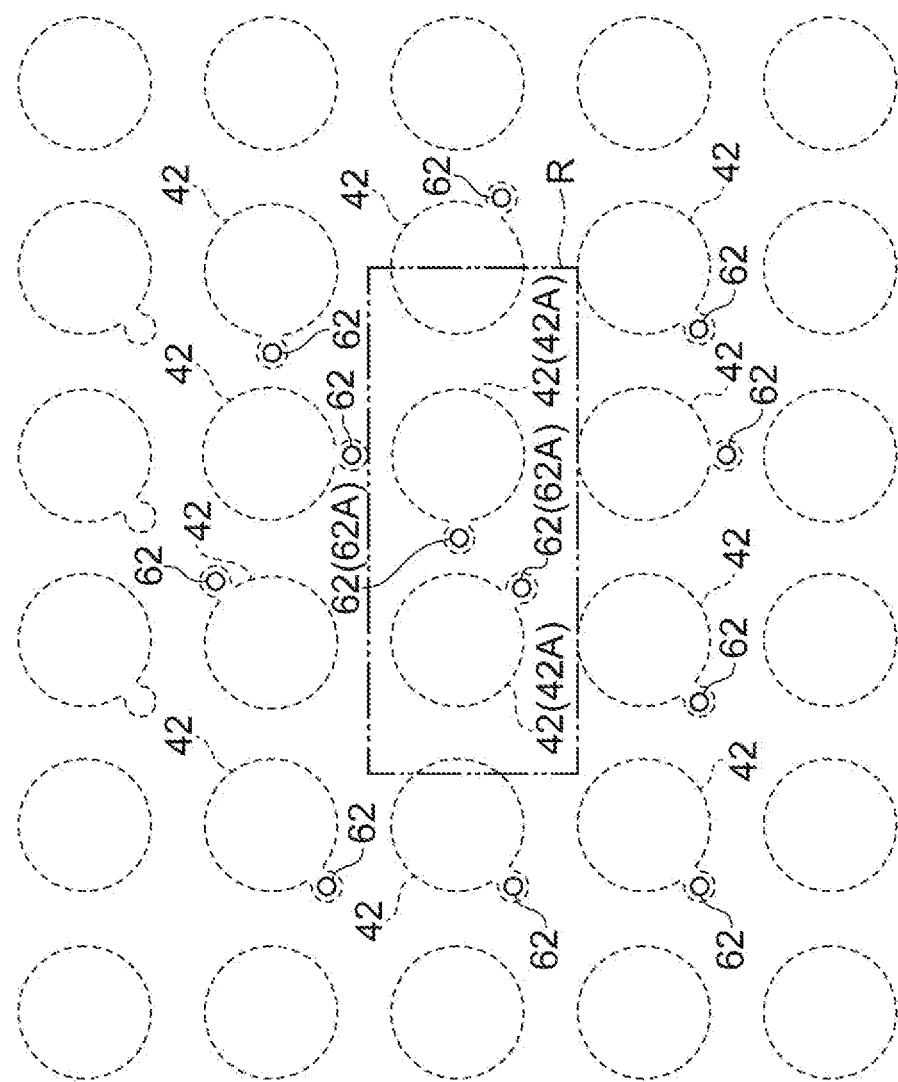
FIG. 4 is a diagram illustrating a positional relationship between a formation area of an electric component, first electrode terminals, and first via-conductors in the electric component embedded structure illustrated in FIG. 1.
Figure 5:
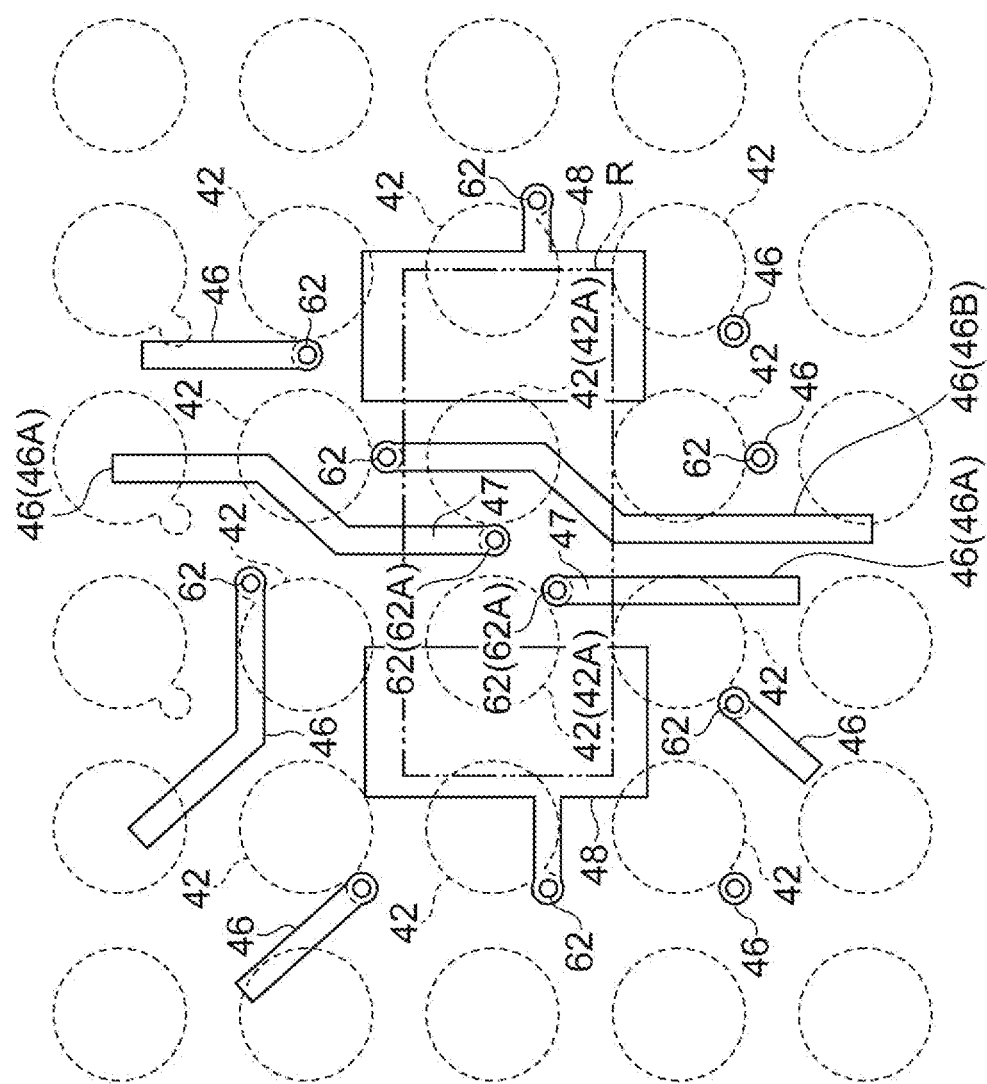
FIG. 5 is a diagram illustrating a positional relationship between a formation area of an electric component, first electrode terminals, first via-conductors, connecting portions, and wirings in the electric component embedded structure illustrated in FIG. 1.
Figure 6:
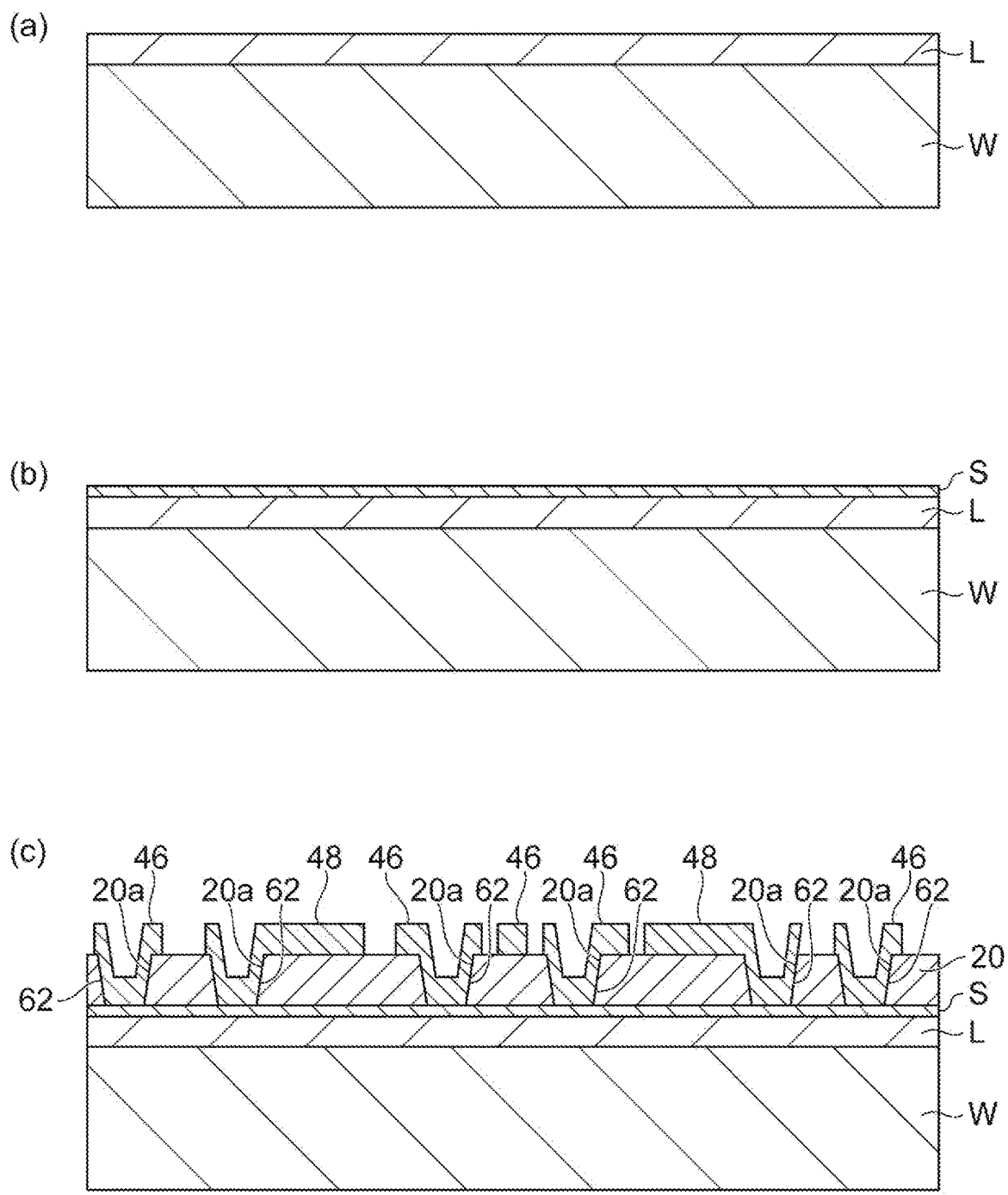
FIG. 6 is a diagram illustrating steps of a method of manufacturing the electric component embedded structure illustrated in FIG. 1.

As illustrated in FIGS. 3 to 5, a plurality of first electrode terminals 42 are regularly arranged when seen in the stacking direction of the electric component embedded structure 1. Each first electrode terminal 42 has a substantially circular shape and more specifically includes a large-circle portion in which the solder bump 43 (see FIG. 2) is to be formed and a small-circle portion which is to be connected to the first via-conductor 62.

The formation area of the electric component 10 is a rectangular area which is indicated by an alternate long and two-short dash line in FIGS. 3 to 5. One or more first electrode terminals 42 (two first electrode terminals 42 in the drawings) are located in the formation area R of the electric component 10. In the following description, a first electrode terminal which is located in the formation area R of the electric component 10 out of the plurality of first electrode terminals 42 is also referred to as an intra-area terminal 42A.

As illustrated in FIG. 4, each first via-conductor 62 extends from the first electrode terminal 42 in the stacking direction of the electric component embedded structure 1 and the top thereof is exposed from the top surface of the first insulating layer 20. The first via-conductor 62A extending from the intra-area terminal 42A extends in the stacking direction of the electric component embedded structure 1 in the formation area R of the electric component 10 and the top thereof is exposed from the top surface of the first insulating layer 20.

As illustrated in FIG. 5, a pair of first electrode terminals 42 other than the intra-area terminal 42A out of the plurality of first electrode terminals 42 are connected to the pair of connecting portions 48 formed on the first insulating layer 20. The first electrode terminals 42 other than the intra-area terminal 42A are connected to the wirings 46 formed on the first insulating layer 20.

The intra-area terminal 42A of the plurality of first electrode terminals 42 is connected to the overlap wiring 46A of the wirings 46 formed on the first insulating layer 20. The overlap wiring 46A is a wiring extending to the formation area R of the electric component 10 when seen in the stacking direction thereof and includes an overlap portion 47 terminating in the formation area R. The intra-area terminal 42A is electrically connected to the overlap portion 47 of the overlap wiring 46A via the first via-conductor 62A.

In this embodiment, the plurality of wirings 46 formed on the first insulating layer 20 include a crossing wiring 46B crossing the formation area R of the electric component 10 (that is, not terminating in the formation area R) in addition to the overlap wiring 46A. The crossing wiring 46B is electrically connected to the first electrode terminal 42 other than the intra-area terminal 42A.

A method of manufacturing the electric component embedded structure 1 will be described below with reference to FIGS. 6 to 11.

FIGS. 6 to 11 illustrate the method of manufacturing one electric component embedded structure 1, but a plurality of electric component embedded structures 1 are actually manufactured at a time by forming a structure of a plurality of electric component embedded structures 1 on one wafer and then segmenting the resultant. Accordingly, in FIGS. 6 to 11, a part of a wafer (a part corresponding to one electric component embedded structure 1) is enlarged.

When an electric component embedded structure 1 is manufactured, a wafer W having a function of a support substrate is prepared and a temporary adhesive layer L is formed on the wafer W as illustrated in FIG. 6(a). The material of the wafer W is not particularly limited and, for example, a glass wafer can be used. The temporary adhesive layer L can be formed using a known method such as a spin coating method. A wafer W in which the temporary adhesive layer L is formed in advance may be prepared.

Then, as illustrated in FIG. 6(b), a seed layer S is formed on the temporary adhesive layer L. The seed layer S is formed of, for example, a conductive material such as Cu. As illustrated in FIG. 6(c), the first insulating layer 20 is stacked on the seed layer S, and the first insulating layer 20 is patterned using a known patterning technique to form a through-hole 20a in the first insulating layer 20 at a position at which each first via-conductor 62 is formed. A plating layer is formed on the patterned first insulating layer 20 by electroplating. Out of the plating layer, the plating layer formed in the through-hole 20a of the first insulating layer 20 constitutes the first via-conductor 62 and the plating layer formed on the first insulating layer 20 constitutes the wirings 46 and the connecting portions 48.

Then, as illustrated in FIG. 7(a), the first layer 31 of the second insulating layer is formed to cover the whole first insulating layer 20 on which the plating layer is formed. The first layer 31 of the second insulating layer is patterned using a known patterning technique to form the cavity portion 33 in the area corresponding to the connecting portions 48 formed on the first insulating layer 20.

Then, as illustrated in FIG. 7(b), an electric component 10 is installed in the cavity portion 33, and a component 18 which is to be the electric component 10 in the cavity portion 33 is connected to the connecting portions 48 via the conductive material layer 15. The component 18 which is to be the electric component 10 includes one Ni thick-film electrode 12A which is to be a pair of second electrode layers 12. Before or after the component 18 which is to be the electric component 10 is installed, a space V which is defined by the component 18 which is to be the electric component 10 and the first insulating layer 20 is filled with the insulating resin 70. Accordingly, the wirings 46 located below the component 18 which is to be the electric component 10 are covered by the insulating resin 70.

As illustrated in FIG. 7(c), a resist 82 is provided to surround the component 18 which is to be the electric component 10 and an etching process is performed to decrease the thickness of the Ni thick-film electrode 12A. Then, as illustrated in FIG. 8(a), a resist 84 is provided to cover the resist 82 and an area which is to be the second electrode layer 12 out of the Ni thick-film electrode 12A and an etching process is performed. As a result, as illustrated in FIG. 8(b), the electric component 10 including a pair of second electrode layers 12 is obtained. After the etching process, the resists 82 and 84 are removed.

Then, as illustrated in FIG. 9(a), the second layer 34 of the second insulating layer is stacked to integrally cover the first layer 32 and the electric component 10 accommodated in the cavity portion 33, and the second layer 34 is patterned using a known patterning technique to form a through-hole 34a in the second layer 34 at a position at which each second via-conductor 64 is formed. Then, as illustrated in FIG. 9(b), a plating layer is formed on the patterned second layer 34 of the second insulating layer 30 by electroplating. In the plating layer, a plating layer which is formed in the through-hole 34a of the second layer 34 of the second insulating layer 30 constitutes the second via-conductor 64, and a plating layer which is formed on the second layer 34 of the second insulating layer 30 constitutes the second electrode terminal 44.

Finally, the temporary adhesive layer L and the wafer W are removed and the first electrode terminal 42 is formed on the first main surface 1a which is exposed by removal, whereby the electric component embedded structure 1 is completed. Thereafter, an external electric component 50 (see FIG. 2) is mounted on the electric component embedded structure 1. At this time, the external electric component 50 is electrically connected to the second electrode terminals 44 via the solder bumps 45. Then, the external electric component 50 is encapsulated using a resin or the like.

Figure 10:
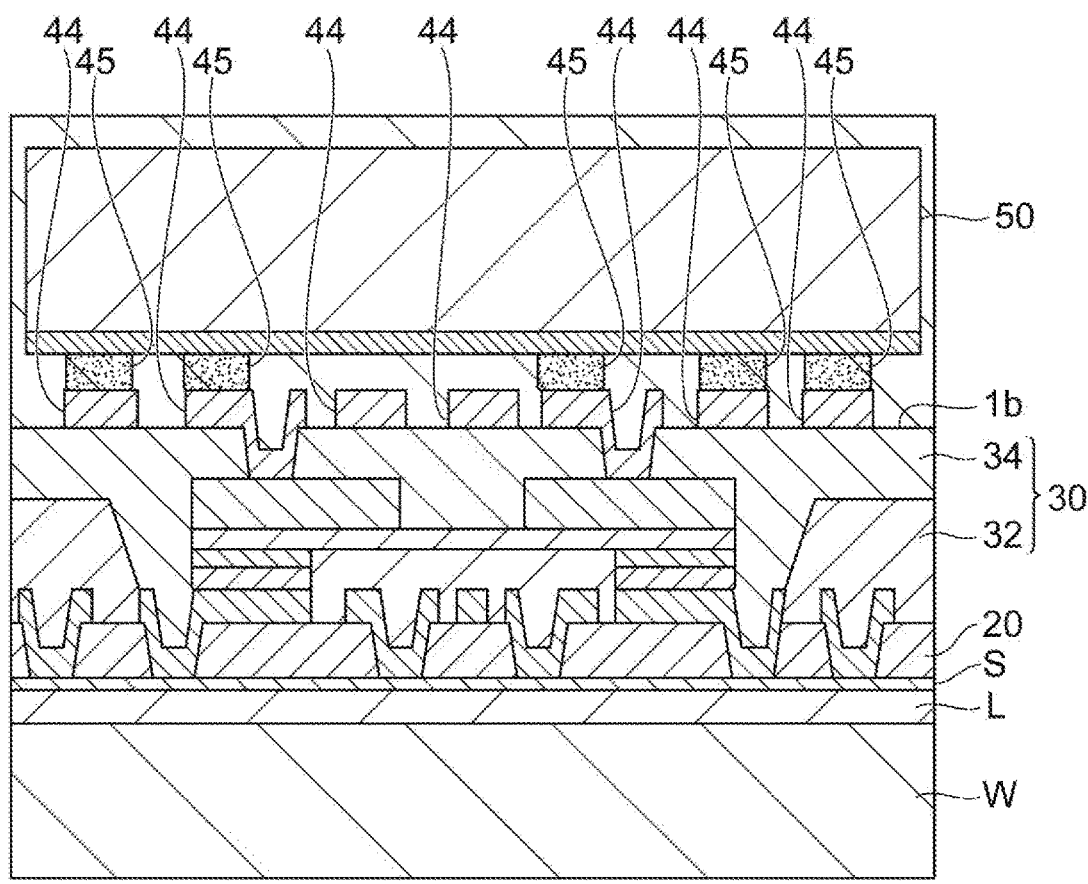
FIG. 10 is a diagram illustrating a modified example of the method of manufacturing the electric component embedded structure illustrated in FIG. 1.

Unlike the above manufacturing method, the external electric component 50 may be mounted on the second main surface 1b and be sealed using a resin as illustrated in FIG. 10 after the step of forming the second electrode terminals 44 illustrated in FIG. 9(b), and then the temporary adhesive layer L and the wafer W may be removed. Thereafter, the first electrode terminals 42 are formed on the first main surface 1a which is exposed by removal, whereby the electric component embedded structure 1 is completed.

Figure 11:
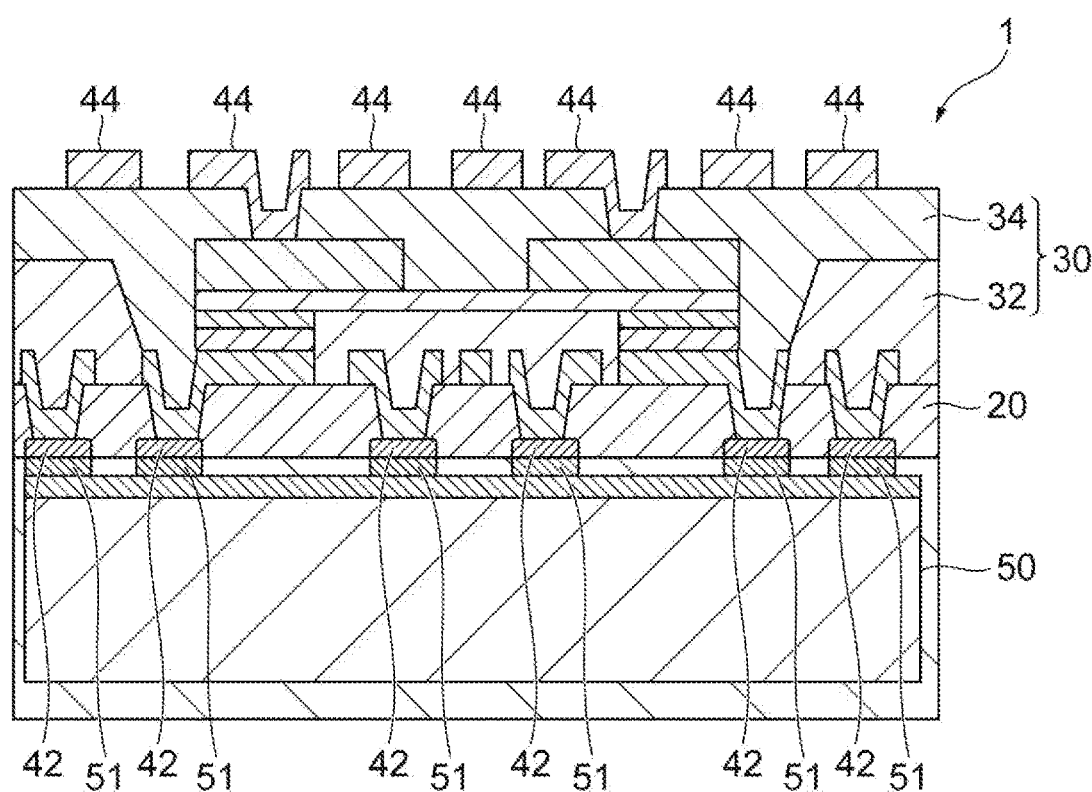
FIG. 11 is a diagram illustrating a modified example of the method of manufacturing the electric component embedded structure illustrated in FIG. 1.

As illustrated in FIG. 11, a component embedded wafer in which the external electric component 50 is embedded may be used instead of the wafer W. In this case, the electric component embedded structure 1 which is obtained through the steps subsequent to FIG. 6(c) may be formed on the component embedded wafer in which connection terminals 51 of the external electric component 50 are exposed from the top surface.

As described above, the electric component embedded structure 1 includes: the first insulating layer 20 constituting the first main surface 1a; the wirings 46 being stacked on the first insulating layer 20; the connecting portions 48 being formed in the same layer as the wirings 46; the electric component 10 being mounted on the connecting portions 48 and including the first electrode layer 11 which is located close to the connecting portions 48 in the stacking direction and electrically connected to the connecting portions 48 and the second electrode layer 12 located on the side opposite to the first electrode layer 11; the second insulating layer 30 integrally covering the electric component 10 and the wirings 46 formed on the first insulating layer 20; a plurality of first electrode terminals 42 being provided on the first main surface 1a; a plurality of second electrode terminals 44 being provided on the second main surface 1b; a plurality of first via-conductors 62 extending in the stacking direction, penetrating the first insulating layer 20, and electrically connecting the wirings 46 and the connecting portions 48 to the first electrode terminals 42; and a plurality of second via-conductors 64 extending in the stacking direction, penetrating the second insulating layer 30, and electrically connecting the second electrode layer 12 of the electric component 10 to the second electrode terminals 44. In the electric component embedded structure 1, the plurality of first electrode terminals 42 include an intra-area terminal 42A which is located in the formation area R of the electric component 10 when seen in the stacking direction, and the overlap wiring 46A extends to the formation area R of the electric component 10 and terminates in the formation area R when seen in the stacking direction and includes an overlap portion 47 being electrically connected to the intra-area terminal 42A via the first via-conductor 62A in the formation area R of the electric component 10.

Figure 12:
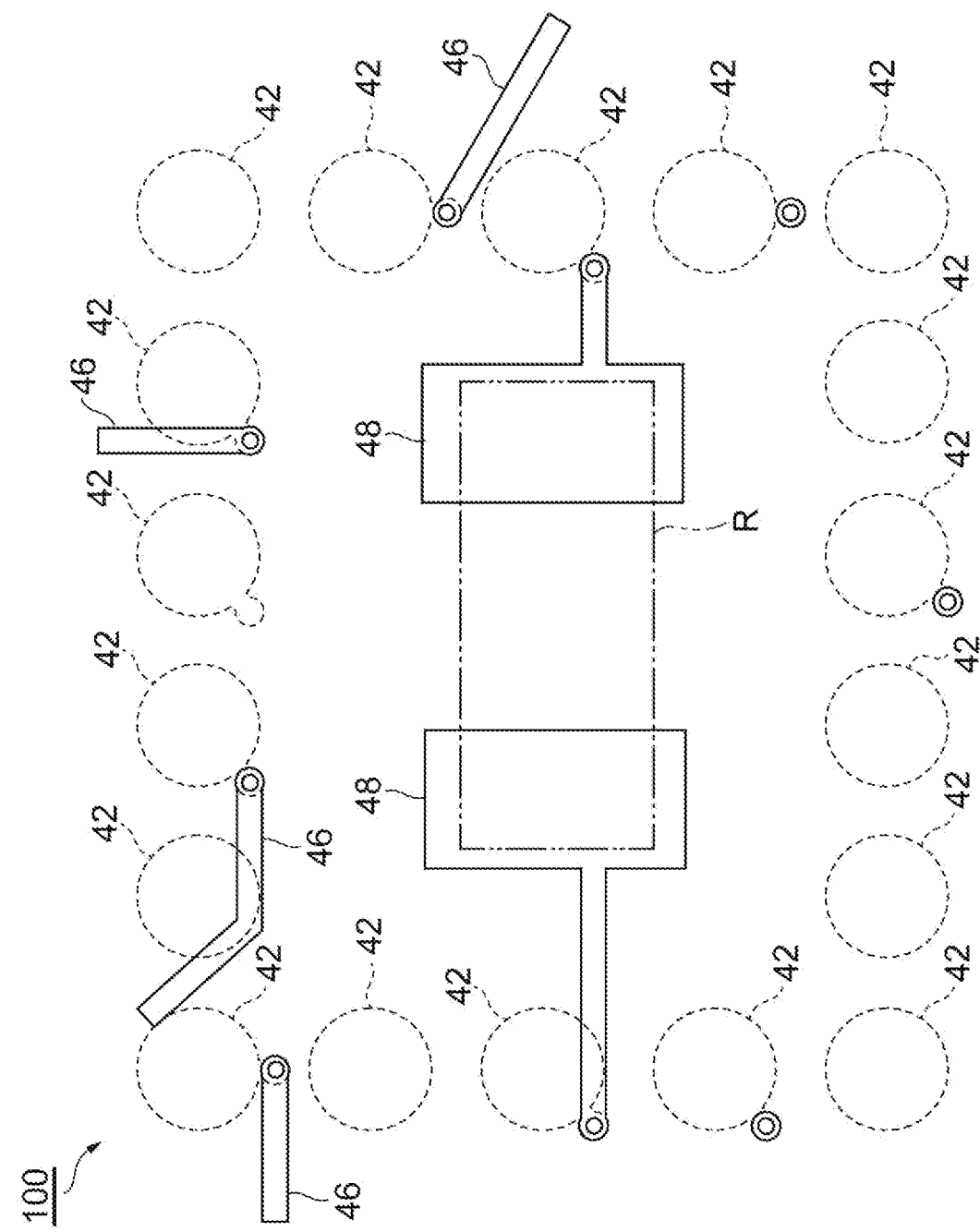
FIG. 12 is a diagram illustrating a positional relationship between a formation area of an electric component, first electrode terminals, first via-conductors, connecting portions, and wirings in an electric component embedded structure according to the related art.

Here, when the first electrode terminals 42 are not provided in the formation area R of an electric component like an electric component embedded structure 100 according to the related art illustrated in FIG. 12, the first electrode terminals 42 cannot be arranged with a high density and an increase in mounting area of the electric component embedded structure is caused. Therefore, the inventors achieved a decrease in mounting area of the electric component embedded structure 1 by arranging the first electrode terminals 42, particularly, the first electrode terminals 42 not being connected to the electrodes (the first electrode layer 11) of the electric component 10, on the first main surface 1a corresponding to the formation area R of the electric component 10. That is, in the electric component embedded structure 1, the first electrode terminals 42 provided on the first main surface 1a include intra-area terminals 42A, and each intra-area terminal 42A is electrically connected to the overlap portion 47 of the corresponding overlap wiring 46A in the formation area R of the electric component 10. Accordingly, it is possible to realize a decrease in mounting area of the electric component embedded structure 1.

The intra-area terminals 42A can be electrically connected to the second electrode terminals 44 provided on the second main surface 1b via the first via-conductors 62, the overlap wirings 46A, and the second via-conductors 64.

Since the intra-area terminals 42A are connected to the wirings 46 (the overlap wirings 46A) on the first insulating layer 20 without additionally providing a rewiring layer which causes an increase in thickness, it is possible to curb an increase in thickness and to achieve a decrease in size of the electric component embedded structure 1.

Figure 13:
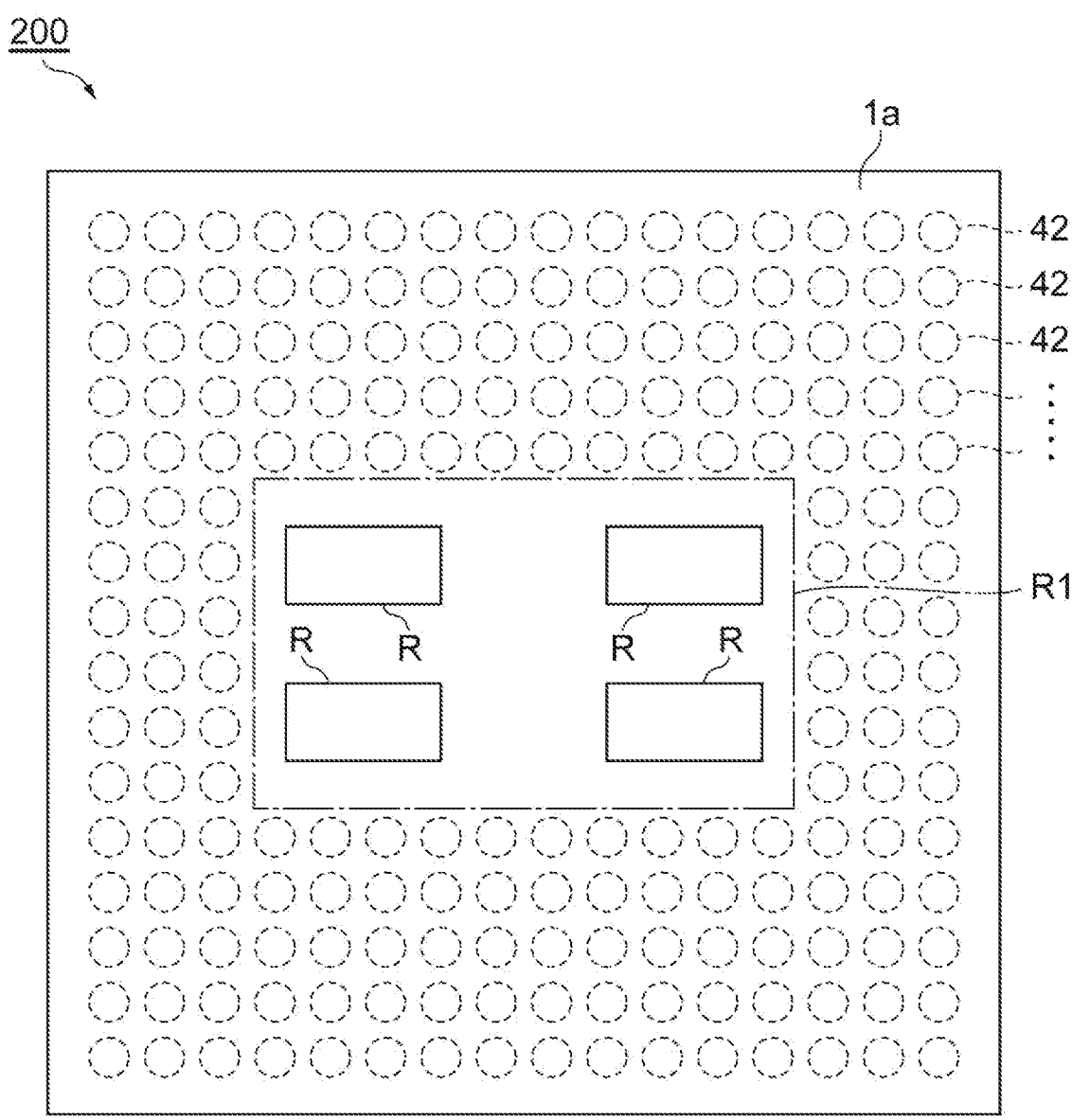
FIG. 13 is a diagram illustrating a positional relationship between a formation area of an electric component, first electrode terminals, first via-conductors, connecting portions, and wirings in an electric component embedded structure according to the related art.

When a plurality of electric components and formation areas R thereof are adjacent to each other in an in-plane direction of the first main surface 1a (a direction perpendicular to the stacking direction) like an electric component embedded structure 200 according to the related art illustrated in FIG. 13, the first electrode terminals 42 cannot be disposed in the formation areas R and surrounding areas thereof and thus the formation area R of the plurality of electric components adjacent to each other is considered as one large formation area R1. As a result, the first electrode terminals 42 cannot be provided in the one large formation area R1 and a large mounting area is required for the electric component embedded structure 200.

Figure 14:
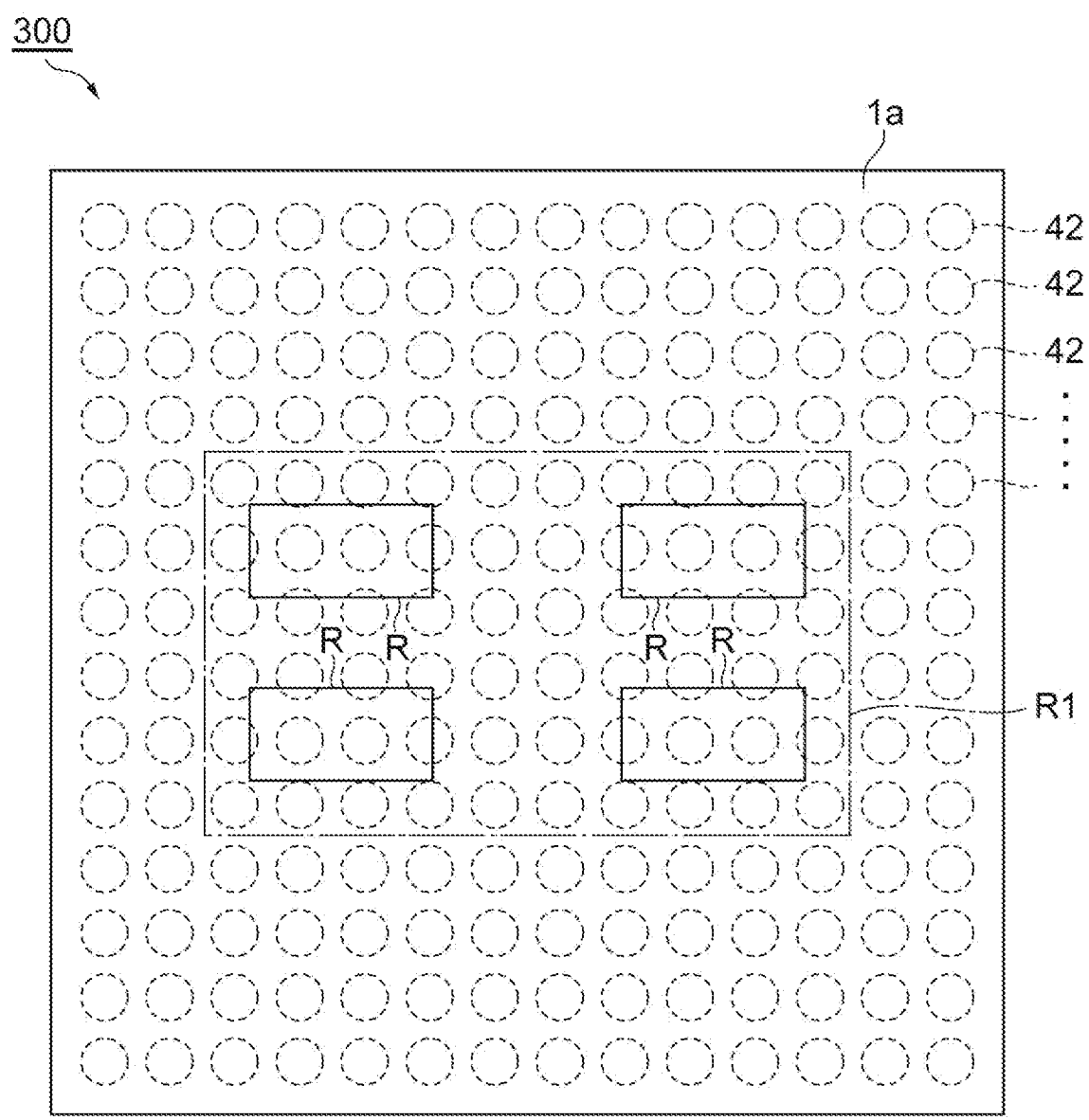
FIG. 14 is a diagram illustrating a positional relationship between a formation area of an electric component and first electrode terminals in an electric component embedded structure other than that illustrated in FIG. 1.

On the other hand, when a plurality of electric components and formation areas R thereof are adjacent to each other in the in-plane direction of the first main surface 1a like an electric component embedded structure 300 illustrated in FIG. 14 and the intra-area terminals 42A which are located in the formation areas R and the formation area R1 are provided, the first electrode terminals 42 can be arranged with a high density and a decrease in mounting area of the electric component embedded structure 300 is achieved. For example, in the electric component embedded structure 300 illustrated in FIG. 14, the same number of first electrode terminals 42 (i.e. 196 terminals) as the electric component embedded structure 300 illustrated in FIG. 13 are provided, but are arranged with a high density, whereby a decrease in mounting area (for example, the area of the first main surface 1a) is achieved.

In the electric component embedded structure 1, the second insulating layer 30 includes the first layer 32 and the second layer 34 which are sequentially stacked from the first insulating layer 20 side. The first layer 32 includes the cavity portion 33 which is open to expose the connecting portions 48 on the first insulating layer 20, and the electric component 10 is disposed in the cavity portion 33. By disposing the electric component 10 in the cavity portion 33 of the second insulating layer 30 in this way, it is possible to achieve a decrease in thickness of the electric component embedded structure 1.

The electric component embedded structure 1 includes the insulating resin (the insulator) 70 which is interposed between the electric component 10 and the first insulating layer 20, and the overlap portions 47 of the overlap wirings 46A are covered by the insulating resin 70. By covering the overlap portions 47 of the overlap wirings 46A with the insulating resin 70 in this way, an influence of an external force on the overlap portions 47 of the overlap wirings 46A is decreased and a short circuit or the like is less likely to occur. Accordingly, it is possible to further narrow the overlap portions 47 of the overlap wirings 36A or other wirings 46. As a result, it is possible to have greater latitude for design of the wirings 46.

The overlap wiring 46A terminating in the formation area R of the electric component 10 and the crossing wiring 46B crossing the formation area R include a portion which is located at a position interposed between a pair of connecting portions 48 as illustrated in FIG. 5. In the portion which is located at a position interposed between a pair of connecting portions 48, the overlap wiring 46A and the crossing wiring 46B have a shield effect of decreasing an influence of electromagnetic waves (noise).

The electric component embedded structure 1 includes a plurality of wirings 46, and the plurality of wirings 46 include the overlap wiring 46A including the overlap portion 47 terminating in the formation area R of the electric component 10 and the crossing wiring 46B crossing the formation area R of the electric component 10. The crossing wiring 46B does not have to bypass the formation area R of the electric component 10 and thus it is possible to have greater latitude for design of the wirings 46.

Figure 15:
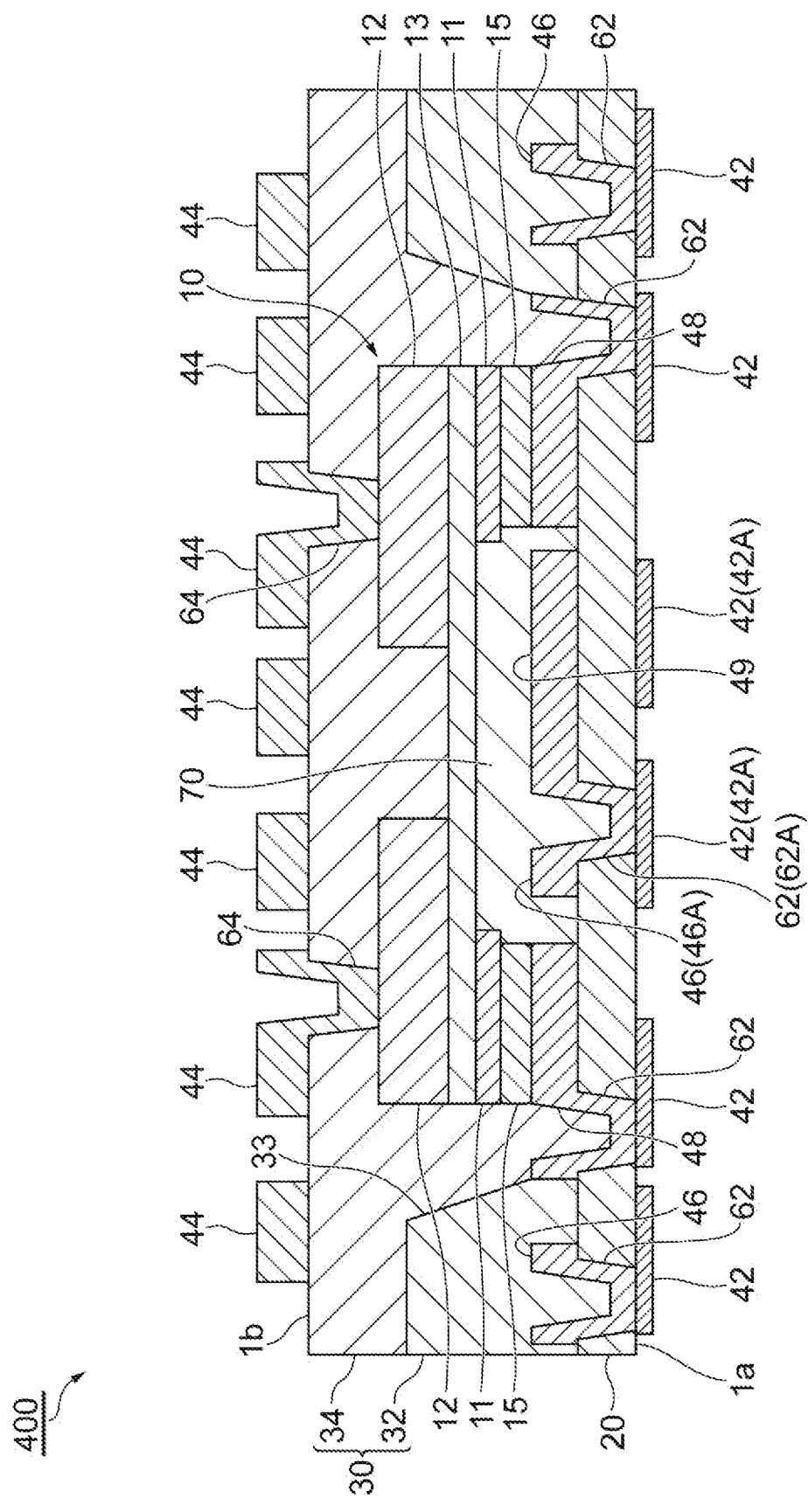
FIG. 15 is a sectional view schematically illustrating a modified example of the electric component embedded structure illustrated in FIG. 1.

A modified example of the electric component embedded structure 1 illustrated in FIG. 1 will be described below with reference to FIG. 15. As illustrated in FIG. 15, an electric component embedded structure 400 according to a modified example includes an electric component 10, a first insulating layer 20, and a second insulating layer 30 similarly to the electric component embedded structure 1. Wirings 46 and connecting portions 48 are formed on the first insulating layer 20. The electric component embedded structure 400 is different from the electric component embedded structure 1 in that an overlap wiring 46A provided in the formation area R of the electric component 10 includes an extension portion 49 extending in the in-plane direction perpendicular to the stacking direction. When seen in the stacking direction, the extension portion 49 is greater in size (for example, a width and a length) than other wirings 46. The extension portion 49 can be formed of a wiring material of a solid pattern. In this way, since the area occupied by the wiring material in the formation area R increases due to the overlap wiring 46A including the extension portion 49, it is possible to achieve improvement in heat dissipation of the electric component 10 and/or a component which is disposed above or below the electric component embedded structure 400.

Figure 16:
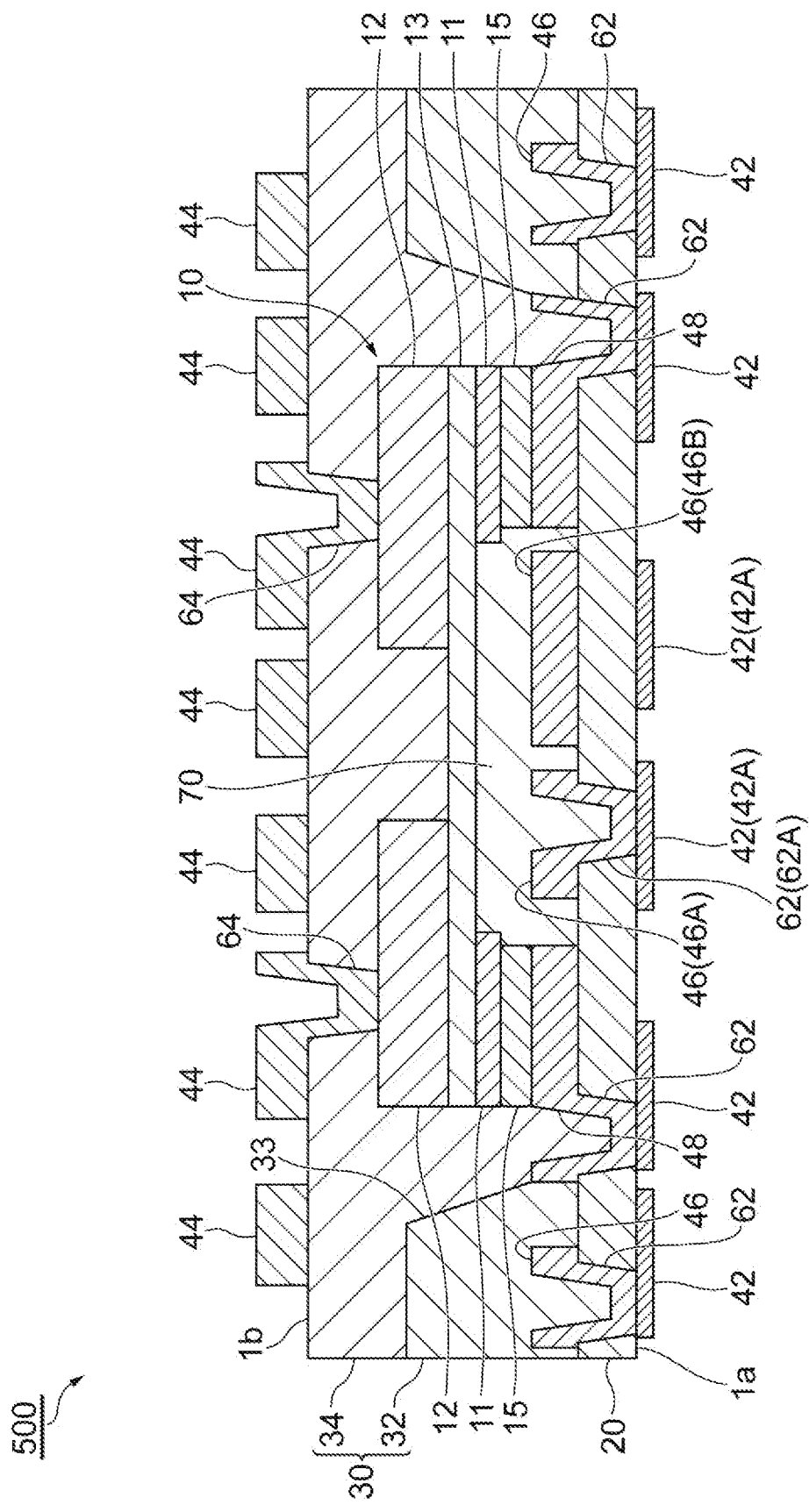
FIG. 16 is a sectional view schematically illustrating another modified example of the electric component embedded structure illustrated in FIG. 1.

Another modified example of the electric component embedded structure 1 illustrated in FIG. 1 will be described below with reference to FIG. 16. As illustrated in FIG. 16, an electric component embedded structure 500 according to another modified example includes an electric component 10, a first insulating layer 20, and a second insulating layer 30 similarly to the electric component embedded structure 1. The electric component embedded structure 500 is different from the electric component embedded structure 1 in that the size (for example, a width and a length) of a crossing wiring 46B in the in-plane direction perpendicular to the stacking direction becomes greater. The crossing wiring 46B can be formed of a wiring material of a solid pattern. In this way, since the area occupied by the wiring material in the formation area R increases due to the enlargement of the crossing wiring 46B, it is possible to achieve improvement in heat dissipation of the electric component 10 and/or a component which is disposed above or below the electric component embedded structure 500 similarly to the electric component embedded structure 400.

While embodiments of the present disclosure have been described above, the present disclosure is not limited to the embodiments and can be subjected to various modifications. For example, in the above embodiments, an example in which electrode layers (the first electrode layer 11 and the second electrode layer 12) are provided on both top and bottom surfaces of the electric component 10 has been described, but the present disclosure can also be applied to an electric component embedded structure 1 including an electric component 10 having an electrode layer on only the bottom surface. In this case, the electric component embedded structure 1 may not include the second electrode terminals 44 and the second via-conductors 64.

REFERENCE SIGNS LIST 1, 100, 200, 300, 400, 500 Electric component embedded structure
1a First main surface
1b Second main surface
10 Electric component
11 First electrode layer
12 Second electrode layer
13 Dielectric layer
20 First insulating layer
30 Second insulating layer
32 First layer
33 Cavity portion
34 Second layer
42 First electrode terminal
42A Intra-area terminal
44 Second electrode terminal
46 Wiring
46A Overlap wiring
46B Crossing wiring
47 Overlap portion
48 Connecting portion
62, 62A First via-conductor
64 Second via-conductor
70 Insulating resin
R, R1 Formation area

The invention claimed is:

1. An electronic component embedded structure having a first main surface and a second main surface opposite to the first main surface, the electronic component embedded structure comprising:
 a first insulating layer constituting the first main surface;
 a connecting portion;
 an electronic component mounted on the connecting portion, the electronic component being located on a same side as the connecting portion in a stacking direction of the structure, and having a first electrode layer electrically connected to the connecting portion;
 a plurality of first electrode terminals provided on the first main surface, the plurality of first electrode terminals including an intra-area terminal in an overlapping area of the electronic component in the stacking direction, the plurality of first electrode terminals each including:
 a large-circle portion; and
 a small-circle portion;
 a wiring stacked on the first insulating layer, the wiring being in a same layer as the connecting portion and extending into and terminating in the overlapping area;
 a second insulating layer on the first insulating layer and integrally covering the electronic component and the wiring;
 a plurality of first via-conductors penetrating the first insulating layer in the stacking direction, and electrically connecting the wiring and the connecting portion to the small-circle portions of the first electrode terminals; and
 an overlap portion of the wiring that is electrically connected to the intra-area terminal via one of the first via-conductors in the overlapping area.

2. The electronic component embedded structure according to claim 1, further comprising:
 a second electrode layer of the electronic component located on an opposite side of the first electrode layer;
 a plurality of second electrode terminals on the second main surface; and
 a plurality of second via-conductors extending in the stacking direction, penetrating the second insulating layer, and electrically connecting the second electrode layer of the electronic component to the second electrode terminals.

3. The electronic component embedded structure according to claim 1, wherein the second insulating layer includes a first layer and a second layer, the first layer and the second layer are stacked sequentially from the first insulating layer side, and
 wherein the first layer includes a cavity portion open to expose the connecting portion on the first insulating layer and the electronic component is disposed in the cavity portion.

4. The electronic component embedded structure according to claim 1, further comprising an insulator interposed between the electronic component and the first insulating layer, wherein the overlap portion of the wiring is covered by the insulator.

5. The electronic component embedded structure according to claim 1, comprising a plurality of the wirings,
wherein the plurality of wirings include a wiring including the overlap portion terminating in the overlapping area and a wiring crossing the overlapping area.

6. The electronic component embedded structure according to claim 1, comprising a plurality of the electronic components and a plurality of the connecting portions corresponding to the electronic components,
wherein the plurality of electronic components are arranged adjacent to each other in a direction perpendicular to the stacking direction.

7. The electronic component embedded structure according to claim 1, wherein the large-circle portions are configured to accommodate a solder bump.

* * * * *